United States Patent [19]

Hulsing, II

[11] Patent Number: 5,095,264

[45] Date of Patent: Mar. 10, 1992

[54] FREQUENCY COUNTER AND METHOD OF COUNTING FREQUENCY OF A SIGNAL TO MINIMIZE EFFECTS OF DUTY CYCLE MODULATION

[75] Inventor: Rand H. Hulsing, II, Redmond, Wash.

[73] Assignee: Sundstrand Data Control, Inc., Redmond, Wash.

[21] Appl. No.: 581,726

[22] Filed: Sep. 12, 1990

[51] Int. Cl.⁵ .......................................... G01R 23/02
[52] U.S. Cl. ................................ 324/79 D; 324/78 D; 377/28; 377/19; 377/37; 377/39
[58] Field of Search ................ 377/19, 28, 37, 39; 324/78 R, 78 D, 79 R, 79 D

[56] References Cited

U.S. PATENT DOCUMENTS

| | | |
|---|---|---|
| 4,050,747 | 9/1977 | Ruhnau .......................... 324/78 D |
| 4,395,762 | 7/1983 | Wondergem et al. . |
| 4,454,470 | 6/1984 | Boetter et al. . |
| 4,541,105 | 9/1985 | Lee et al. . |
| 4,544,884 | 10/1985 | Hayashi . |
| 4,607,217 | 8/1986 | Bhargava . |
| 4,609,990 | 9/1986 | Sember et al. . |
| 4,670,712 | 6/1987 | Lavergnat et al. . |
| 4,786,861 | 11/1988 | Hulsing, II et al. . |

Primary Examiner—Kenneth A. Wieder
Assistant Examiner—Jose M. Solis
Attorney, Agent, or Firm—Christensen O'Connor

[57] ABSTRACT

A dual-edge frequency counter and method for minimizing the effects of duty cycle modulation. In its simplest form, a dual-edge counter (50) includes a first counter (52) that accumulates reference clock pulses between successive rising edges of an input signal. An input signal is also applied to an inverter (54), which inverts the square wave signal prior to applying it to a second counter (56) that also accumulates reference clock cycles between successive rising edges of the inverted sensor signal. A summation junction (60) totals the accumulated counts from the first and second counters so that they can be averaged by a divider (62), which divides the total count by two. The technique is also employed in connection with a frequency counter that includes an integer counter (72) for totaling the number of cycles of the sensor signal occurring during a sample time defined by successive gate signals. The integer count, N, is then corrected for the compensated average of partial periods of the signal occurring at the beginning and the end of the sample time. The compensated average partial period corrects for variations in the sensor signal duty cycle caused either by noise superimposed on a sinusoidal signal produced by a quartz crystal (12) or as a result of variations in power supply level for the crystal oscillator.

26 Claims, 3 Drawing Sheets

FREQUENCY COUNTER AND METHOD OF COUNTING FREQUENCY OF A SIGNAL TO MINIMIZE EFFECTS OF DUTY CYCLE MODULATION

TECHNICAL FIELD

This invention generally relates to a high-resolution frequency counter and method of counting the frequency of a signal, and more particularly, to an apparatus and method for determining the frequency for a signal that is subject to duty cycle modulation.

BACKGROUND OF THE INVENTION

Accelerometers and other types of sensors often include one or more crystal oscillators that produce a signal having a frequency that varies as a function of a measured parameter, such as acceleration. The frequency of this signal can be determined simply by counting the number of cycles of the signal occurring during a sample time of known duration. However, instrumentation used to monitor the frequency of a crystal oscillator in applications requiring high resolution typically "counts the frequency" in terms of cycles of a reference clock operating at a much higher frequency than the sensor crystal and thus avoids having to measure frequency over unacceptably long sample periods. The signal produced by a quartz crystal is sinusoidal and is usually converted to a square wave of equivalent frequency before being counted by the instrumentation. The frequency-counting instrumentation typically includes a counter that accumulates reference clock cycles during one or more periods of the square wave signal, where each such period extends from a rising edge to a rising edge, or from a falling edge to a falling edge of the square wave. Even better resolution of the signal frequency is achieved in real time, during continuous frequency monitoring, by using a combination of the two techniques, i.e., by counting integer numbers of cycles of the sensor signal that start during a sample time and correcting the integer number for any fractional portions of the sensor period that occur at the beginning and at the end of the sample time. The fractional portions of the sensor period are determined by counting cycles of the reference clock on additional counters Commonly assigned U.S. Pat. No. 4,786,861 discloses a frequency-counting apparatus and method that uses an integer cycle counter in combination with counters that determine fractional portions of a sensor signal to achieve high resolution. The integer counter accumulates the total number of sensor periods or cycles that begin during a sample time. A partial period counter accumulates reference clock cycles during the portion of a sensor signal period or cycle that immediately follows the end of a sample time, and a full period counter determines the number of reference clock cycles that occurred during that entire sensor signal period or cycle, starting from just prior to the end of the sample time. The ratio of these two counts, i.e., the partial count divided by the full count, defines a fractional portion of the sensor signal period or cycle that is subtracted from the integer cycle count. In addition, a fractional portion of the sensor signal period, which was determined at the end of the last sample time and stored, is added to the result, yielding a corrected total count for the sample time. The frequency of the sensor signal is then determined simply by dividing the corrected total count by the known sample time.

An exemplary prior art crystal oscillator circuit 10 of the type used in an accelerometer is shown in FIG. 1. One of the problems associated with this circuit is its susceptibility to duty cycle modulation errors. A quartz crystal 12 in the circuit generates a periodically varying sinusoidal piezoelectric current having a frequency that changes as a function of a measured parameter, e.g., acceleration. The current produced by quartz crystal 12 is applied to the input of a high-impedance amplifier 14, comprising a complementary metal oxide semiconductor (CMOS) inverter 16 and a high-impedance (resistance greater than 100 Kohms) feedback resistor 18. The output of inverter 16 is applied to another CMOS inverter 20, which further shapes the signal so that a square wave signal 34 is output from the oscillator. The output signal is connected back to quartz crystal 12 through a resistor 22 and referenced to ground by a resistor 24. High-impedance amplifier 14 operates around a switch point level that is equal to about one-half of the power supply voltage (power supply not shown). The duty cycle of the square wave signal output from oscillator circuit 10 is thus readily affected by noise modulation of the sinusoidal signal developed by quartz crystal 12 and/or by the stability of the power supply voltage.

Noise modulation of the signal from quartz crystal 12 can occur due to pickup of stray electromagnetic interference (EMI), for example, from the AC line, or as a result of capacitive coupling of other signals to the signal produced by the quartz crystal. Variations in the DC power supply level can also modulate the duty cycle of the output square wave in an analogous manner. Such power supply modulation is relatively common, since small changes in the DC level of the power supply can occur even if a voltage regulator is used in the power supply.

FIG. 2 illustrates how a lower frequency noise signal superimposed on the sinusoidal signal from quartz crystal 12 (or variations in the DC voltage of the power supply) causes duty cycle modulation of the square wave output signal from oscillator circuit 10. The combined signal 30, representing the sum of the noise and quartz crystal signals, crosses a switch point level 32 of high-impedance amplifier 14 at varying, spaced-apart intervals, $t_1$-$t_n$, during each cycle. At each point in time where combined signal 30 crosses switch point level 32, a change in the output signal occurs, corresponding to either a rising edge 36 or a falling edge 38, thereby producing square wave output signal 34. Thus, the duty cycle of the resulting square wave signal varies from cycle to cycle, as indicated by the variation between successive values of $x_i$. Similarly, even in the absence of noise, variations in power supply voltage changes switch point level 32 of high-impedance amplifier 14, producing a comparable variation in duty cycle by varying the time intervals $t_1$-$t_n$ between which the sinusoidal signal crosses the switch point level. Since the frequency of the square wave output signal from oscillator circuit 10 is preferably, at least in part, determined by counting reference clock signals between successive rising edges OR between successive falling edges of the square wave output signal, it should be apparent that the duty cycle modulation of this signal in this manner contributes to an error in the overall determination of frequency.

Accordingly, it is an object of the present invention to eliminate, or at least minimize, errors in counting the frequency of a signal caused by duty cycle modulation. It is a further object to minimize the effect of noise modulation on counting the frequency of a signal. A still further object is to minimize the effect of variations in power supply voltage in circuitry that converts a sinusoidally varying signal to a square wave signal, particularly the effect on determining the frequency of the sinusoidal signal by counting reference clock cycles. These and other objects and advantages of the present invention will be apparent from the attached drawings and the Description of the Preferred Embodiments that follow.

SUMMARY OF THE INVENTION

Figure 1:
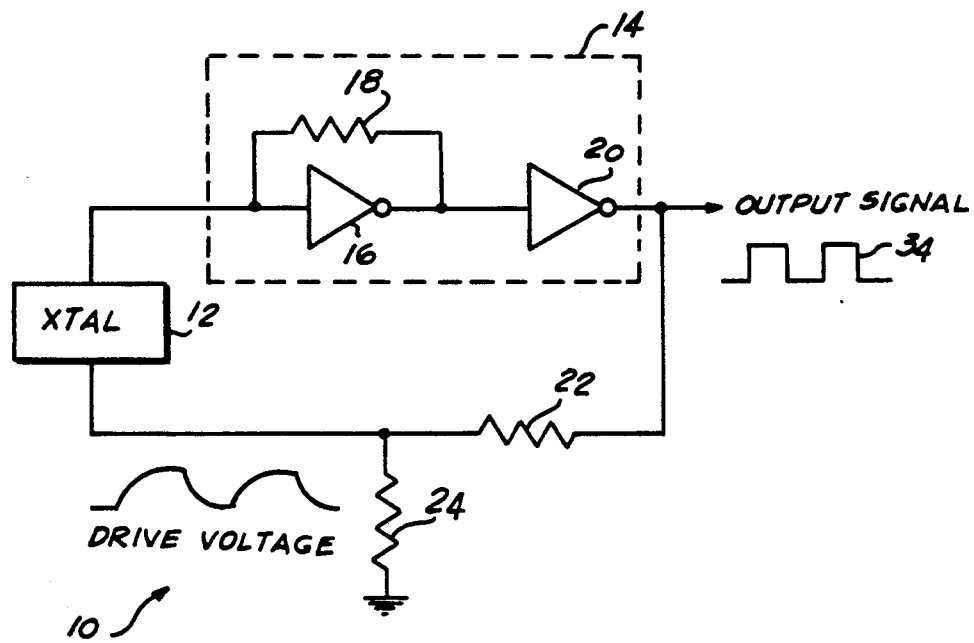
FIG. 1 is a schematic block diagram of a prior art crystal oscillator.
Figure 2:
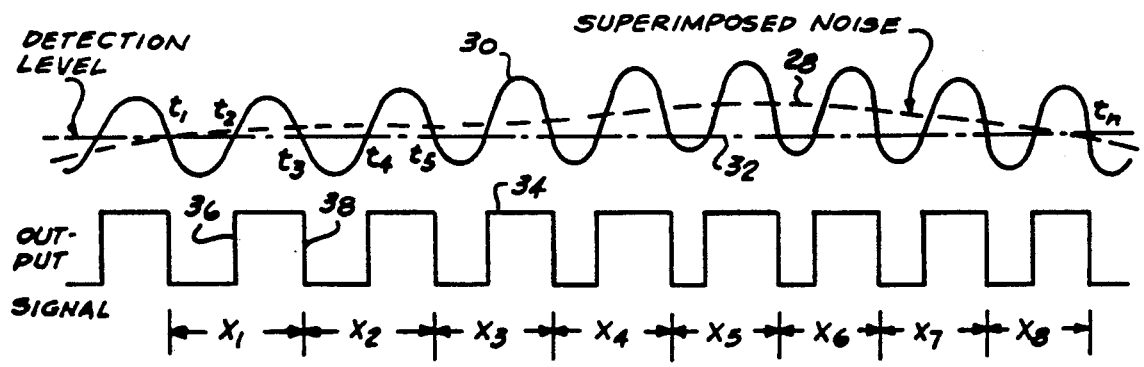
FIG. 2 is a graphic illustration of duty cycle modulation of the square wave signal output from the crystal oscillator of FIG. 1.

In accordance with the present invention, apparatus is provided for determining a frequency count of a sensor signal in terms of clock cycles produced by a reference so as to minimize the effect of duty cycle modulation of the sensor signal. The sensor signal is periodic and is thus characterized by an alternately rising and falling amplitude that has a leading edge and a trailing edge. The apparatus includes first counter means for accumulating a first count of the clock cycles that occur between successive leading edges of the sensor signal and second counter means for accumulating a second count of the clock cycles that occur between successive trailing edges of the sensor signal. Processor means are provided for determining a corrected average of the first and second counts. The corrected average compensates for the effect of the duty cycle modulation.

In one embodiment, the processor means comprise summing means for determining a total count of the clock cycles by adding the first count to the second count, and divisor means for dividing the total count by two. One of the first and the second counter means includes an inverter that inverts the sensor signal before the clock cycles are accumulated. The first and second counter means respectively begin to accumulate each of the first and the second counts at times that are temporally spaced apart by substantially one-half of a sensor signal period.

In another embodiment, the processor means determine the corrected average of either C successive first counts and C−1 successive second counts, or of C−1 successive first counts and C successive second counts. In either case, C is a positive integer at least equal to two.

In another embodiment, the apparatus includes gating means for producing successive gate signals that determine a sample time. The sample time extends temporally from one gate signal until the next. The apparatus also comprises integer counter means for accumulating an integer number of cycles of the sensor signal that occur during the sample time. The first counter means comprise a full count leading edge-triggered counter and a partial count leading edge-triggered counter. Similarly, the second counter means comprise a full count trailing edge-triggered counter and a partial count trailing edge-triggered counter. The full count leading and trailing edge-triggered counters accumulate clock cycles for a complete period of the sensor signal coincident with one of the gate signals. The partial count leading and trailing edge-triggered counters accumulate clock cycles corresponding to fractional parts of the period of the sensor signal, immediately after one of the gate signals. In this embodiment, the processor means determine the corrected average of a fractional portion, $F_j$, of the sensor signal period that is outside the sample time. This fractional portion is used in adjusting the integer count to determine the frequency count for the sensor signal.

To count frequency, the full count trailing edge-triggered counter accumulates f1 clock cycles; the partial count trailing edge-triggered counter accumulates p1 clock cycles; the full count leading edge-triggered counter accumulates f2 clock cycles; and, the partial count leading edge-triggered counter accumulates p2 clock cycles. The fractional portion, $F_j$, of the sensor signal is then defined by the expression:

$$F_j = \left[ \frac{p1}{f1} + \frac{p1}{f2} + k \right]/2 \qquad (1)$$

where k is equal to $+\frac{1}{2}$ if p1/f1 > p2/f2 and otherwise, is equal to $-\frac{1}{2}$. The integer counter means determine an integer number of cycles, N, of the sensor signal for the sample time, and the processor means determine the frequency count for the sensor signal for each sample time according to the expression:

$$\text{Frequency Count} = N - F_j + F_{j-1} \qquad (2)$$

where $F_{j-1}$ is a fractional portion of a sensor signal period determined at the end of an immediately preceding sample time.

A method for counting a frequency of a periodic sensor signal having a leading edge and a trailing edge in terms of clock cycles, so as to minimize the effect of a duty cycle modulation of the sensor signal is another aspect of the present invention. The steps of the method are generally consistent with the functions implemented in the above description of the apparatus for counting frequency.

DESCRIPTION OF THE PREFERRED EMBODIMENTS

Figure 3:
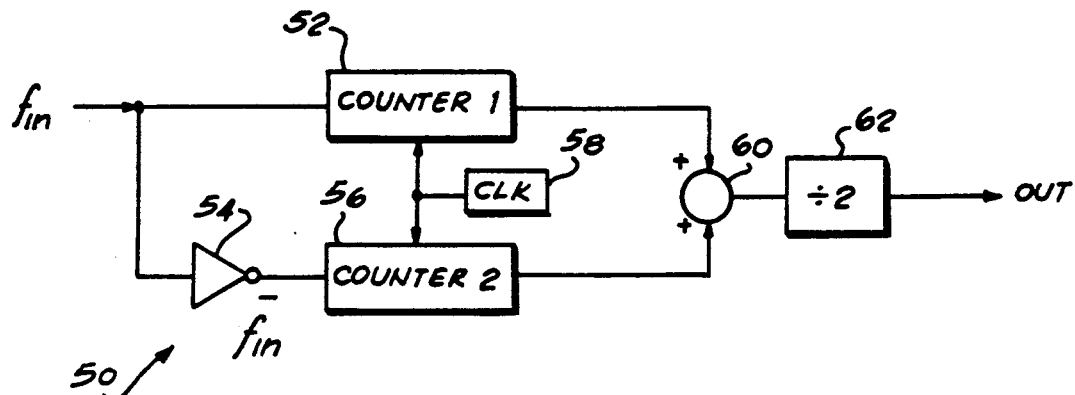
FIG. 3 is a schematic block diagram of a dual edge-triggered counter in accordance with the present invention.

A simplistic block diagram for a dual-edge counter, which comprises the simplest form of the present invention, is illustrated in FIG. 3 at reference numeral 50. Dual-edge counter 50 is intended to compensate for duty cycle modulation such as that which appears on modulated square wave output signal 34 from prior art crystal oscillator 10 (FIG. 1). Modulated square wave output signal 34 is input to dual-edge counter 50 and split into two different circuit paths. A first counter 52 accumulates reference clock cycles produced by a reference clock 58, between successive rising edges of the sensor output signal from crystal oscillator 10. The sensor output signal is also applied to an inverter 54, which inverts the sensor output signal before it is input to a counter 56. Counter 56 also accumulates reference clock pulses from reference clock 58 between successive rising edges of the inverted sensor signal. It should be apparent that successive rising edges of an inverted square wave signal correspond to successive falling edges of the noninverted square wave signal. Accordingly, counter 52 and counter 56 are displaced in time by approximately one-half period or cycle of the sensor signal applied to dual-edge counter 50.

To achieve meaningful resolution in determining the frequency of the sensor signal, reference clock 58 must operate at a substantially higher frequency than that of the sensor signal. Preferably, the reference clock has a frequency of 30 MHz, but for other applications, a different reference clock frequency may be more appropriate. In any case, the reference clock must run at a sufficiently high frequency to provide the required frequency counting resolution.

The accumulated total counts of reference clock cycles between successive rising edges of the input signal and of the inverted input signal from counters 52 and 56, respectively, are summed in a summing junction 60. The total count from summing junction 60 is supplied to a divider 62, which divides the total count by two, producing an average frequency count for the sensor input signal.

Because the rising edges of the sensor signal and inverted sensor signal are displaced in time by approximately one-half of the input cycle, the total count developed by summing junction 60 extends over one-and-one-half periods of the input signal. It would be possible to synchronize the time intervals over which counter 52 and counter 56 accumulate reference clock cycles by introducing a time delay approximately equal to one half of the input signal cycle ahead of one of the counters. However, providing such a delay would likely introduce a mixing error in the event that the sensor signal duty cycle significantly changes between half cycles so that exact cancellation of the duty cycle variation does not occur.

Alternatively, successive sensor signal counts provided by one of the two counters can be averaged in a post-processing algorithm, prior to being averaged with the count from the other counter. Thus, for example, reference clock cycles for a sensor signal period t and for a successive sensor signal period t+1 accumulated by counter 52 can be averaged together and the result added to the accumulated reference clock cycle count from counter 56 for the sensor signal period t+½, producing a total accumulated count. The total accumulated count is then further divided by two to obtain an average count for the entire period. This post-processing algorithm is clearly expressed by the following equation:

$$\text{Avg. Count} = \frac{1}{2}\left(\frac{C1_t + C1_{t+1}}{2} + C2_{t+\frac{1}{2}}\right) \quad (3)$$

where $C1_t$ equals the accumulated count in counter 52 for period t, $C1_{t+1}$ equals the accumulated count for counter 52 for period t+1, and $C2_{t+\frac{1}{2}}$ equals the accumulated count of counter 56 for period t+½.

This process can be extended to achieve greater resolution so that counter 52 accumulates reference clock pulses over n periods of the input signal and counter 56 accumulates clock pulses over n−1 periods of input signal (or vice versa). However, by extending the interval over which the sensor signal frequency is counted, a concomitant reduction in the ability to track cycle-to-cycle changes in the frequency of the sensor signal occurs.

The algorithm defined by Equation (1) is capable of tracking first order changes in the frequency of the input signal without error. Furthermore, the algorithm improves over the simplistic averaging technique illustrated in FIG. 3, while increasing the delay to obtain a frequency count by only one-quarter of a sensor signal sample period. In addition, the algorithm tracks out ramping data noise and improves the resolution with which the frequency count is determined over that of dual-edge counter 50 by approximately a factor of 1.7. To double the data processing rate achievable by following the algorithm in Equation (3), a complementary algorithm can be employed following each sample of the reference clock accumulated by counter 56, wherein the frequency of the signal at time t+½ is defined as follows:

$$\text{Avg. Count} = \frac{1}{2}\left(\frac{C2_{t+\frac{1}{2}} + C2_{t+1\frac{1}{2}}}{2} + C1_{t+1}\right) \quad (4)$$

where $C2_{t+\frac{1}{2}}$ corresponds to the count of reference cycles accumulated by counter 56 at time t+½; $C2_{t+1\frac{1}{2}}$ is the accumulated count of reference clock cycles for counter 56 at time t+1½; and, $C1_{t+1}$ is the accumulated count for counter 52 at time t+1. It should also be apparent that both the algorithms of Equation (3) and Equation (4) can be employed where the accumulated counts on counters 52 and 56 are reversed. Furthermore, instead of using a summing junction 60 and a divider 62, a processor (not shown) may be employed to carry out the algorithm represented by Equations (3) and (4) in software.

The present invention can also be applied to the frequency counting apparatus and method disclosed in commonly assigned U.S. Pat. No. 4,786,861, in order to minimize the effects of duty cycle modulation on the determination of the frequency provided by a sensor device, such as represented by acceleration-sensitive crystal oscillator 10 (shown in FIG. 1). Since much of the disclosure of that patent is relevant to the present invention, the specification of U.S. Pat. No. 4,786,861 is specifically incorporated herein by reference.

Figure 4:
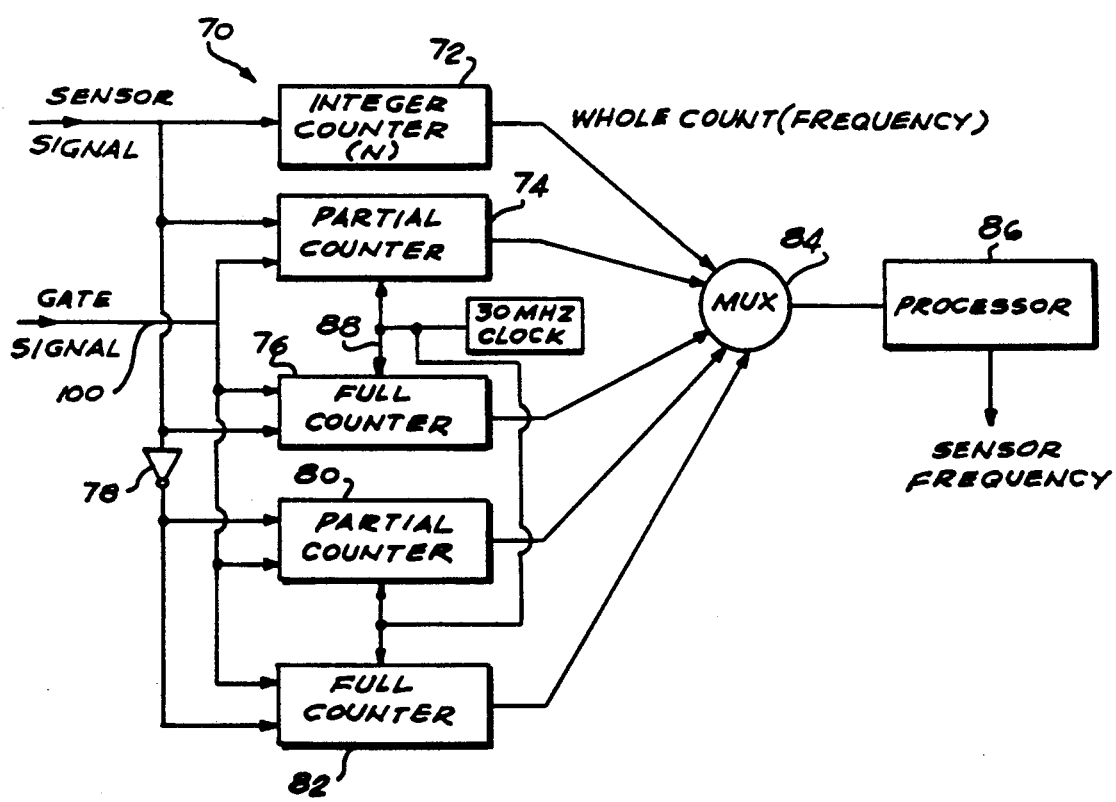
FIG. 4 is a schematic block diagram of a preferred embodiment of the present invention used in connection with a counter that also accumulates an integer number of cycles of the sensor signal.
Figure 5:
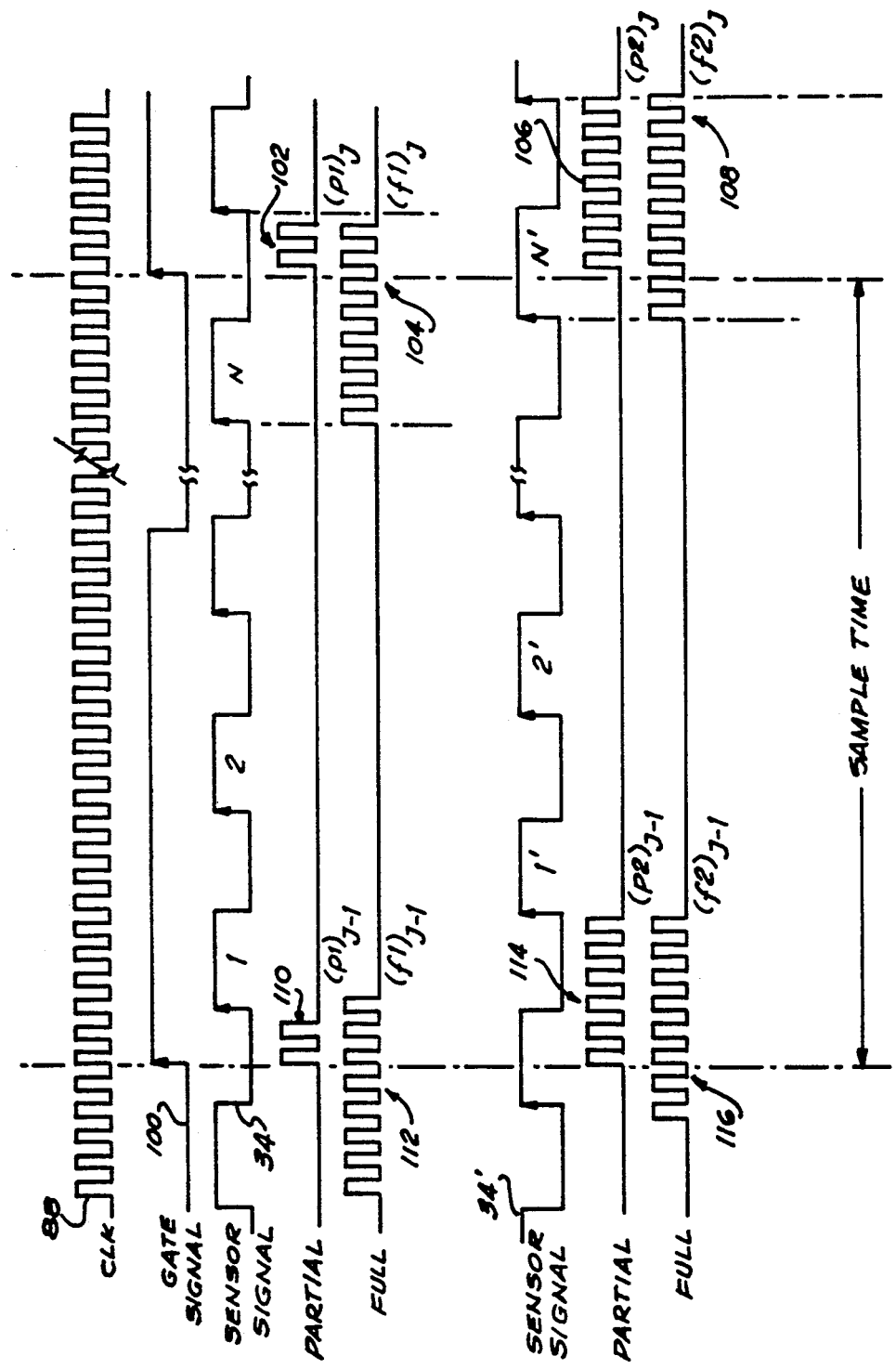
FIG. 5 is a graphic illustration of the signals involved in counting the frequency of the sensor signal as shown in FIG. 4.

As shown in FIGS. 4 and 5, a sensor signal or other signal subject to duty cycle modulation is provided as an input to a dual-edge frequency counter 70. An integer counter 72 accumulates an integer number N corresponding to the number of periods (from rising edge to rising edge or from falling edge to falling edge) of the sensor signal 34 that occur between successive rising edges of a gate signal 100. Gate signal 100 is developed using a frequency divider (not shown) to divide a reference clock signal 88 by a predefined integer dividend. Successive rising edges (or falling edges) of the gate signal thus define a sample time. Accordingly, gate signal 100 is synchronous with reference clock signal 88.

A partial counter 74 accumulates reference clock cycles that occur at the end of each sample time defined by the rising edge of the gate signal. As shown in FIG. 5, a partial count (p1$_j$) is developed by counting reference clock cycles 102 occurring at the end of the sample time until the next rising edge of the sensor signal in partial counter 74. Similarly, a full count (f1$_j$) of reference clock pulses 104 is accumulated in a full counter 76 during the period of the sensor signal that is coincident with the rising edge of gate signal 100 occurring at the end of the sample time.

Sensor signal 34 is also applied to an inverter 78, which produces an inverted sensor signal that is input to a partial counter 80 and to a full counter 82. Partial counter 80 accumulates a partial count (p2$_j$) of reference clock cycles 106 during the interval after the sample time until the next rising edge of the inverted sensor signal 34'. Likewise, full counter 82 accumulates a full count (f2$_j$) of reference clock cycles 108 that occur during the entire period of the inverted sensor signal that is coincident with the gate signal defining the end of the sample time, i.e., from the rising edge that defines the inverted sensor signal until the following rising edge of that signal. The accumulated integer counts, N, in integer counter 72; partial counts, p1$_j$, in partial counter 74; full counts, f1$_j$, in full counter 76; partial counts, p2$_j$, in partial counter 80; and full counts, f2$_j$, in full counter 82 are all supplied to a multiplexer 84, which sequentially or selectively provides the data to a processor 86. In addition, processor 86 includes temporary storage for a corresponding compensated average fractional portion of the sensor signal that extends beyond the end of the preceding sample time.

In FIG. 5, a partial count (p1$_{j-1}$) of reference clock cycles 110 is developed by partial counter 74 at the end of the preceding sample time, j−1. Similarly, a full count (f1$_{j-1}$) of reference clock cycles 112 is accumulated at the end of sample time j−1 by full counter 76; a partial count (p2$_{j-1}$) of reference clock cycles 114 is accumulated in partial counter 80 at the end of the preceding sample time; and finally, a full count (f2$_{j-1}$) of reference clock cycles 116 is accumulated during a full sensor signal period at the end of the last sample time. The partial and full counts for sample time j−1 are used to compute the compensated average for the fractional portion of the sensor signal period, F$_{j-1}$, at the end of that sample time, which is stored temporarily by processor 86. Processor 86 then determines a compensated count of the sensor signal frequency as follows:

$$\text{Comp. Freq. Count} = N - F_j + F_{j-1}. \quad (5)$$

The fractional portions, F$_{j-1}$ and F$_j$ respectively correspond to the compensated average of the partial period of the sensor signal occurring at the end of the j−1 and j sample times and are defined as follows:

$$F_{j-1} = \left[ \frac{p1_{j-1}}{f1_{j-1}} + \frac{p2_{j-1}}{f2_{j-1}} + k \right]/2 \quad (6)$$

$$F_j = \left[ \frac{p1_j}{f1_j} + \frac{p2_j}{f2_j} + k \right]/2 \quad (7)$$

In the preceding equations, the value k depends upon the relative values of p1/f1 and p2/f2 (in either sample times j and j−1). If p2/f2, k is +½; otherwise, k is −½. For example, in FIG. 5, to correct the integer count N for the fractional period of the sensor signal that extends beyond the end of the j sample time, the averaged fractional period of the sensor signal resulting from summing the partial periods for the sensor signal and inverted sensor signal must be compensated for the half period offset of the inverted sensor signal by applying a correction, k, which is −½. Similarly, in calculating the fractional portion F$_{j-1}$, from the averaged fractional periods of the sensor signal and the inverted sensor signal that extend beyond the end of the j−1 sample time, a correction, k, also equal to −½, is applied.

The present invention thus compensates for duty cycle modulation of the fractional portions of the sensor signal used to correct the integer count, N, developed by integer counter 72. With this compensation, duty cycle modulation does not significantly affect the accuracy of the resulting frequency count, at least in respect to first order changes in the duty cycle. As a result, a significant reduction in error in the frequency count is obtained. Once a compensated frequency count is determined, the actual frequency of the sensor signal is determined simply by dividing the compensated frequency count by the sample time.

To improve the calculation speed, thereby permitting more rapid successive real time determination of frequency counts, an approximation may be applied in processor 86 to determine an average full count and an average partial count according to the following equations:

$$fA = \text{Avg. Full Count} = (f1_j + f2_j)/2 \quad (8)$$

$$pA = \text{Avg. Partial Count} = (p1_j + p2_j + k)/2 \quad (9)$$

From these values for the average full count and average partial count, a fraction pA/fA is determined. First order delta terms in the approximation cancel out, producing an acceptable result for a modulation frequency below about two kilohertz. In the event that noise or power supply modulation frequency exceeds two kilohertz, the more exact fractional period determination should be made in accordance with Equation (7). In the preceding algorithm, the value of N must be at least equal to two, to provide any improvement in the accuracy with which frequency is counted. Of course, the frequency count can also be determined by accumulating and averaging reference clock pulses during the entire sample time as noted above in respect to Equations (3) and (4).

Instead of using separate counters and processor 86, an application-specific integrated circuit counter chip embodying all the functional elements shown in FIG. 4 could be employed to provide equivalent performance at relatively lower cost. These and other modifications to the invention within the scope of the claims that follow will be apparent to those of ordinary skill in the art. Accordingly, it is not intended that the disclosure in any way limit the scope of the invention as defined by the claims.

The invention in which an exclusive property or privilege is claimed is defined as follows:

1. Apparatus for determining a frequency count of a sensor signal in terms of clock cycles produced by a reference, so as to minimize the effect of a duty cycle modulation of the sensor signal, said sensor signal being periodic and thus characterized by an alternately rising and falling amplitude that has a leading edge and a trailing edge, comprising:
- (a) first counter means for accumulating a first count of the clock cycles that occur between successive leading edges of the sensor signal;
- (b) second counter means for accumulating a second count of the clock cycles that occur between successive trailing edges of the sensor signal; and
- (c) processor means for determining a corrected average of the first and second counts, said corrected average compensating for the effect of the duty cycle modulation.

2. The apparatus of claim 1, wherein the processor means comprise summing means for determining a total count of the clock cycles by adding the first count to the second count; and divisor means for dividing the total count by two.

3. The apparatus of claim 1, wherein one of the first and the second counter means includes an inverter that inverts said sensor signal before clock cycles are accumulated.

4. The apparatus of claim 1, wherein said first and said second counter means respectively begin to accumulate each of the first and the second counts at times that are temporally spaced apart by substantially one-half of a sensor signal period.

5. The apparatus of claim 4, wherein the processor means determine the corrected average of either C successive first counts and C−1 successive second counts, or of C−1 successive first counts and C successive second counts, where C is a positive integer at least equal to two.

6. The apparatus of claim 1, further comprising gating means for producing successive gate signals that determine a sample time, said sample time extending temporally from one gate signal until a next gate signal.

7. The apparatus of claim 6, further comprising integer counter means for accumulating an integer number of cycles of the sensor signal that occur during the sample time, wherein the first counter means comprises a full count leading edge-triggered counter and a partial count leading edge-triggered counter, and wherein the second counter means comprise a full count trailing edge-triggered counter and a partial count trailing edge-triggered counter, said full count leading and trailing edge-triggered counters accumulating clock cycles for each complete period of the sensor signal during which one of the gate signals occurs, and said partial count leading and trailing edge-triggered counters accumulating clock cycles corresponding to a fractional part of the period of the sensor signal, immediately after said one of the gate signals has occurred, said processor means being further operative to determine the corrected average for a fractional portion, $F_j$, of the sensor signal that is outside the sample time from the clock cycles accumulated by said partial and full count counters, for use in adjusting the integer count to determine the frequency count for the sensor signal.

8. The apparatus of claim 7, wherein the full count trailing edge-triggered counter accumulates f1 clock cycles, the partial count trailing edge-triggered counter accumulates p1 clock cycles, the full count leading edge-triggered counter accumulates f2 clock cycles, and the partial count leading edge-triggered counter accumulates p2 clock cycles, said fractional portion $F_j$ of the sensor signal being defined by the expression:

$$F_j = \left[ \frac{p1}{f1} + \frac{p2}{f2} + k \right] / 2$$

where k equals $+\frac{1}{2}$ if p1/f1 > p2/f2, and otherwise equals $-\frac{1}{2}$.

9. The apparatus of claim 8, wherein the integer counter means determine an integer number of cycles, N, of the sensor signal for the sample time, said processor means being further operative to determine the frequency count for the sensor signal for each sample time according to the expression:

Frequency Count $= N - F_j + F_{j-1}$ where $F_{j-1}$ is the corrected average for a fractional portion of a sensor signal period determined at the end of an immediately preceding sample time.

10. A method for counting a frequency of a periodic sensor signal having a leading edge and a trailing edge in terms of clock cycles, so as to minimize the effect of a duty cycle modulation of the sensor signal, comprising the steps of:
- (a) accumulating a first count of the clock cycles that occur between successive leading edges of the sensor signal;
- (b) accumulating a second count of the clock cycles that occur between successive trailing edges of the sensor signal;
- (c) determining a corrected average of the first and second counts, said corrected average compensating for the effect of the duty cycle modulation.

11. The method of claim 10, wherein the step of determining the corrected average comprises the steps of determining a total count of the clock cycles by adding the first count to the second count; and dividing the total count by two.

12. The method of claim 10, further comprising the step of inverting the sensor signal prior to accumulating the clock cycles for one of the first and the second counts.

13. The method of claim 10, wherein successive first and second counts are respectively accumulated starting at times that are temporally spaced apart by substantially one-half of a sensor signal period.

14. The method of claim 13, wherein the step of determining the corrected average comprises the step of determining the corrected average of either C successive first counts and C−1 successive second counts, or of C−1 successive first counts and C successive second counts, where C is a positive integer at least equal to two.

15. The method of claim 10, further comprising the step of determining a sample time that extends temporally between successive gate signals.

16. The method of claim 15, wherein the step of accumulating the first count comprises the steps of accumulating a full count, f1, of the clock cycles for each complete period of the sensor signal that is coincident with one of the gate signals and accumulating a partial count, p1, of the clock cycles corresponding to fractional periods of the sensor signal occurring immediately after one of the gate signals; and, wherein the step of accumulating the second count comprises the steps of accumulating a full count, f2, of the clock cycles for each complete period of the sensor signal that is coincident with one of the gate signals, and accumulating a partial count, p2, of the clock cycles corresponding to fractional periods of the sensor signal occurring immediately after one of the gate signals; said full counts and partial counts being used to adjust the integer count to determine the frequency count for the sensor signal.

17. The method of claim 16, further comprising the step of determining the corrected average for a fractional portion, $F_j$, of the sensor signal as defined by the expression:

$$F_j = \left[ \frac{p1}{f1} + \frac{p2}{f1} + k \right]/2$$

where k equals $+\frac{1}{2}$ if p1/f1 > p2/f2 and otherwise, equals $-\frac{1}{2}$.

18. The method of claim 17, further comprising the steps of determining an integer number of cycles, N, of the sensor signal for the sample time; and determining the frequency count for the sensor signal for each sample time according to the expression:

Frequency Count = $N - F_j + F_{j-1}$ where $F_{j-1}$ is the corrected average for a fractional portion of a sensor signal period determined at the end of an immediately preceding sample time.

19. Apparatus for measuring the frequency of an input signal that periodically rises and falls in amplitude so as to minimize an error caused by a duty cycle modulation of the input signal, comprising:
(a) a clock oscillator that produces a clock signal having a frequency substantially greater than the input signal;
(b) gate means for producing gate signals, successive gate signals defining sampling times during which the frequency of the input signal is determined;
(c) integer counter means for counting the number of cycles of the input signal, N, that start during each of the sampling times;
(d) rising edge-triggered counting means for determining a first fractional portion of one of the input signal cycles that coincides with one of the gate signals, said first fractional portion being determined in respect to cycles of the clock signal that occur between successive rising amplitudes of the input signal;
(e) falling edge-triggered counting means for determining a second fractional portion of another of the input signal cycles that coincides with the said one of the gate signals, said second fractional portion being determined in respect to cycles of the clock signal that occur between successive falling amplitudes of the input signal; and
(f) processor means for determining the frequency of the input signal as a function of the number of cycles of the input signal during the sample time and of the first and second fractional portions of the input signal at both the beginning and end of the sample time.

20. The apparatus of claim 19, wherein the falling edge counter means are operative to determine a partial count, p1, of cycles of the clock signal that occur after said one of the gate signals and before the next falling amplitude of the input signal occurring after said one of the gate signals, and to determine a full count, f1, of cycles of the clock signal that occur between successive falling amplitudes of the input signal; and wherein the rising edge-triggered counter means are operative to determine a partial count, p2, of cycles of the clock signal that occur after said one gate signal and before the next rising amplitude of the input signal occurring after said one gate signal, and to determine a full count, f2, of cycles of the clock signal that occur between successive rising amplitudes of the input signals, said processor determining a fractional adjustment, $F_j$, to the N cycles counted, at the end of each sample time according to the expression:

$$F_j = \left[ \frac{p1}{f1} + \frac{p2}{f2} + k \right]/2$$

where k equals $+\frac{1}{2}$ if p1/f1 > p2/f2 and otherwise, equals $-\frac{1}{2}$.

21. The apparatus of claim 20, wherein the processor means are operative to store a fractional adjustment, $F_{j-1}$, for each prior sample time and to determine the frequency of the input signal based on the expression:

$N - F_j + F_{j-1}$.

22. A method for measuring the frequency of an input signal that periodically rises and falls in amplitude so as to minimize an error caused by a duty cycle modulation of the signal, comprising the steps of:
(a) producing a clock signal having a frequency substantially greater than the input signal;
(b) producing gate signals, successive gate signals defining sample times during which the frequency of the input signal is determined;
(c) counting a number of cycles of the input signal, N, that start during each of the sample times;
(d) determining a first fractional portion of one of the input signal cycles that coincides with one of the gate signals, said first fractional portion being determined in respect to cycles of the clock signal that occur between successive rising amplitudes of the input signal;
(e) determining a second fractional portion of another of the input signal cycles that coincides with said one of the gate signals, said second fractional portion being determined in respect to cycles of the clock signal that occur between successive falling amplitudes of the input signal; and
(f) determining the frequency of the input signal as a function of the number of cycles of the input signal during the sample time and of the first and second fractional portions of the input signal at both the beginning and end of the sample time.

23. The method of claim 22, wherein the step of determining the first fractional portion comprises the steps of determining a partial count, p1, of cycles of the clock signal that occur after said one of the gate signals and before the next falling amplitude of the input signal occurring after said one gate signal, and determining a full count, f1, of cycles of the clock signal that occur between successive falling amplitudes of the input signal; and wherein the step of determining the second fractional portion comprises the steps of determining a partial count, p2, of cycles of the clock signal that occur after said one gate signal and before the next rising amplitude of the input signal occurring after said one gate signal, and determining a full count, f2, of cycles of the clock signal that occur between successive rising amplitudes of the input signal; further comprising the step of determining a fractional adjustment, $F_j$, to the N cycles at the end of each sample time according to the expression:

$$F_j = \left[ \frac{p1}{f1} + \frac{p2}{f2} + k \right]/2$$

where k equals $+\frac{1}{2}$ if $p1/f2 > p2/f2$ and otherwise, equals $-\frac{1}{2}$.

24. The method of claim 23, further comprising the steps of storing a fractional adjustment, $F_{j-1}$, for a previous sample time and determining the frequency of the input signal based on the expression:

$$N - F_j + F_{j-1}.$$

25. Apparatus for determining a frequency count of a sensor signal in terms of clock cycles produced by a reference, so as to minimize the effect of a duty cycle modulation of the sensor signal, said sensor signal being periodic and thus characterized by an alternately rising and falling amplitude that has a leading edge and a trailing edge, comprising:
  (a) first counter means for accumulating a first count of the clock cycles that occur during a first time interval and a second count of the clock cycles that occur during a second, successive time interval, the first and the second time intervals being defined in respect to leading edges and/or trailing edges of the sensor signal and generally equal to each other in duration, except for variations due to the duty cycle modulation;
  (b) second counter means for accumulating a third count of the clock cycles that occur during a third time interval that is defined in respect to leading edges and/or trailing edges of the sensor signal, the third time interval being different than the first time interval and the second time interval;
  (c) processor means for determining a first average of the first and second counts, and a corrected average of the first average and the third count, said corrected average compensating for the effect of the duty cycle modulation over an entire time interval encompassed by the first, second, and third time intervals.

26. A method for counting a frequency of a periodic sensor signal having a leading edge and a trailing edge in terms of clock cycles, so as to minimize the effect of a duty cycle modulation of the sensor signal, comprising the steps of:
  (a) accumulating a first count of the clock cycles that occur during a first time interval;
  (b) accumulating a second count of the clock cycles that occur during a second time interval, the first and the second time intervals being defined in respect to leading edges and/or trailing edges of the sensor signal and generally equal to each other in duration, except for variations due to the duty cycle modulation;
  (c) accumulating a third count of the clock cycles that occur during a third time interval that is defined in respect to leading edges and/or trailing edges of the sensor signal, the third time interval being different than the first and second time intervals;
  (d) determining a first average of the first and second counts; and
  (e) determining a corrected average of the first average and the third count, said corrected average compensating for the effect of the duty cycle modulation over an entire time interval encompassed by the first, second, and third time intervals.

* * * * *